US008275138B2

(12) United States Patent
Gerrard et al.

(10) Patent No.: US 8,275,138 B2
(45) Date of Patent: Sep. 25, 2012

(54) DYNAMIC ACOUSTIC RENDERING

(75) Inventors: Alan Gerrard, Palo Alto, CA (US); Nam Do, Milpitas, CA (US)

(73) Assignee: Creative Technology Ltd, Singapore (SG)

( * ) Notice: Subject to any disclaimer, the term of this patent is extended or adjusted under 35 U.S.C. 154(b) by 1173 days.

(21) Appl. No.: 11/827,085

(22) Filed: Jul. 9, 2007

(65) Prior Publication Data

US 2008/0069367 A1 Mar. 20, 2008

Related U.S. Application Data

(63) Continuation of application No. 11/246,495, filed on Oct. 6, 2005, now Pat. No. 7,248,701, which is a continuation of application No. 09/305,789, filed on May 4, 1999, now Pat. No. 6,973,192.

(51) Int. Cl.
*H03G 3/00* (2006.01)

(52) U.S. Cl. ................ 381/63; 381/61; 381/64; 463/31; 463/33; 463/35

(58) Field of Classification Search .................... 381/17, 381/61, 309–310, 63–64; 463/31–33, 35
See application file for complete search history.

(56) References Cited

U.S. PATENT DOCUMENTS 6,572,475 B1 * 6/2003 Okabe et al. .................... 463/30
6,760,050 B1 * 7/2004 Nakagawa .................... 715/848

* cited by examiner

*Primary Examiner* — Goins Davetta
*Assistant Examiner* — Disler Paul
(74) *Attorney, Agent, or Firm* — Creative Technology Ltd

(57) ABSTRACT

A method of acoustically rendering a virtual environment is described. The method includes receiving a subset of polygons derived for an acoustic display from a set of polygons generated for a graphical display. Acoustic reflections are determined from a sound source that bounce off of polygons in the subset of polygons to a listener position in the virtual environment. It is determined whether a polygon in the subset of polygons causes an occlusion of the sound source at the listener position, and a play list of sounds is generated based on the reflections and occlusions.

19 Claims, 17 Drawing Sheets

DYNAMIC ACOUSTIC RENDERING

CROSS REFERENCE TO RELATED APPLICATIONS

This application is a continuation of co-pending U.S. patent application Ser. No. 11/246,495, entitled DYNAMIC ACOUSTIC RENDERING filed Oct. 6, 2005 now U.S. Pat. No. 7,248,701 which is incorporated herein by reference for all purposes, which is a continuation of U.S. patent application Ser. No. 09/305,789, now U.S. Pat. No. 6,973,192, entitled DYNAMIC ACOUSTIC RENDERING filed May 4, 1999 which is incorporated herein by reference for all purposes.

FIELD OF THE INVENTION

The present invention relates generally to acoustic modeling. More specifically, a system and method for rendering an acoustic environment including a listener, sound sources, occlusions, and reflections is disclosed.

BACKGROUND OF THE INVENTION

Direct path 3D audio is used to render sound sources in 3 dimensions to a listener. In addition to simulating the sources themselves, a more realistic experience may be provided to the user by also simulating the interaction of the sources with the objects in a virtual environment. Such objects may occlude certain sound sources from the listener and also may reflect sound sources. For example, sounds originating in a virtual room would sound differently to a listener depending on the size of the room and sounds originating in an adjacent room would sound differently depending on whether such sounds were occluded by a wall or were transmitted via a path through an open door. In an open environment, reflected sounds from other objects affect the perception of a listener. The familiar experience of hearing the reflection by passing telephone poles of sounds from a car in which a passenger is traveling is an example of such reflections. Rendering such sounds dynamically would greatly enhance an acoustic virtual reality experience for a listener.

FIG. 1 is a block diagram illustrating a virtual scene in which a listener is located in a virtual environment that includes sound sources. A listener 100 is located in a chamber that is defined by walls 102*a*, 102*b*, 102*c*, and 102*d*. A sound source 104*a* and a sound source 104*b* generate sounds that may be heard by the listener. An obstacle defined by walls 106*a*, 106*b*, 106*c*, and 106*d* is located between listener 100 and sound source 104*b*. Wall 106*d* includes a door 108*a* and wall 106*b* includes a door 108*b*. The doors may be either open or closed and may affect whether or not walls 106*d* and 106*b* block sound from source 104*b* from reaching listener 100. A solid object 110 is also located within the chamber.

The walls of the chamber may reflect the sounds generated by the sound sources, creating echoes and reverberations that create for the listener a perception of the spaciousness of the room. In addition, objects in the room may also reflect sound from the sound sources or occlude the sound sources, preventing sound from reaching the listener or muffling the sound.

The listener's perception of such a virtual acoustic environment could be greatly enhanced if the relative position of the listener, the sources, the objects, and the walls of the chamber could be dynamically modeled as the listener, the sources, and the objects move about the virtual chamber as a result of a simulation or game that is running on a computer. However, current systems do not provide for real time dynamic acoustic rendering of such a virtual environment because of the processing demands of such a system.

Prior systems either have required off line processing to precisely render a complex environment such as a concert hall or have modeled acoustic environments in real time by relatively primitive means such as providing selectable preset reverberation filters that modify sounds from sources. The reverberations provide a perceived effect of room acoustics but do not simulate effects that a virtual listener would perceive when moving about an environment and changing his or her geometrical position with respect to walls and other objects in the virtual environment. Acoustic reflections have been modeled for simple environments such as a six sided box, but no system has been designed for dynamic acoustic rendering of a virtual environment including multiple sources and moving objects in real time.

A method is needed for efficiently rendering reflections and occlusions of sound by various objects within a virtual environment. Ideally, such a method would require a minimum of additional programming of the application simulating the virtual environment and would also minimize processing and memory requirements.

SUMMARY OF THE INVENTION

A system for providing efficient real time dynamic acoustic rendering is disclosed. Wavetracing™ is used to simulate acoustic scenes in real time on an ordinary personal computer, workstation or game console. Acoustic surfaces are derived from a set of polygons provided by an application for graphics processing. Direct path 3D audio is augmented with acoustic reflections, dynamic reverberations, and occlusions generated by the acoustic surfaces. A three dimensional environment of listeners, sound sources and acoustic surfaces is derived from graphics data used by a graphics engine that is modified and reused to acoustically render a virtual scene. An acoustic environment that parallels a graphics scene being rendered is rendered from the perspective of the listener in the graphics scene. A subset of selected polygons from the graphics scene are rendered as acoustic surfaces and reflections or occlusions of the acoustic surfaces are modeled for sounds generated by sound sources. By judiciously selecting the subset of polygons to be rendered acoustically and optimizing the processing of the interaction of those surfaces with the sound sources, graphics data is efficiently reused to render an acoustic environment.

It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

In one embodiment, a method of acoustically rendering a virtual environment is disclosed. The method includes receiving a subset of polygons derived for an acoustic display from a set of polygons generated for a graphical display. Acoustic reflections are determined from a sound source that bounce off of polygons in the subset of polygons to a listener position in the virtual environment. It is determined whether a polygon in the subset of polygons causes an occlusion of the sound source at the listener position, and a play list of sounds is generated based on the reflections and occlusions.

In another embodiment, a method of acoustically rendering a virtual environment is disclosed. The method includes deriving a set of polygons for a graphical display. A first subset of the polygons and a second subset of the polygons are selected for an acoustic display. Acoustic reflections from a sound source that bounce off of the polygons in the first subset of polygons to a listener position in the virtual environment are determined. It is also determined whether a polygon in the second subset of polygons causes an occlusion of the sound source at the listener position. A play list is generated of sounds based on the reflections and the occlusions.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

A detailed description of a preferred embodiment of the invention is provided below. While the invention is described in conjunction with that preferred embodiment, it should be understood that the invention is not limited to any one embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, details relating to technical material that is known in the technical fields related to the invention has not been described in detail in order not to unnecessarily obscure the present invention in such detail.

Figure 1:
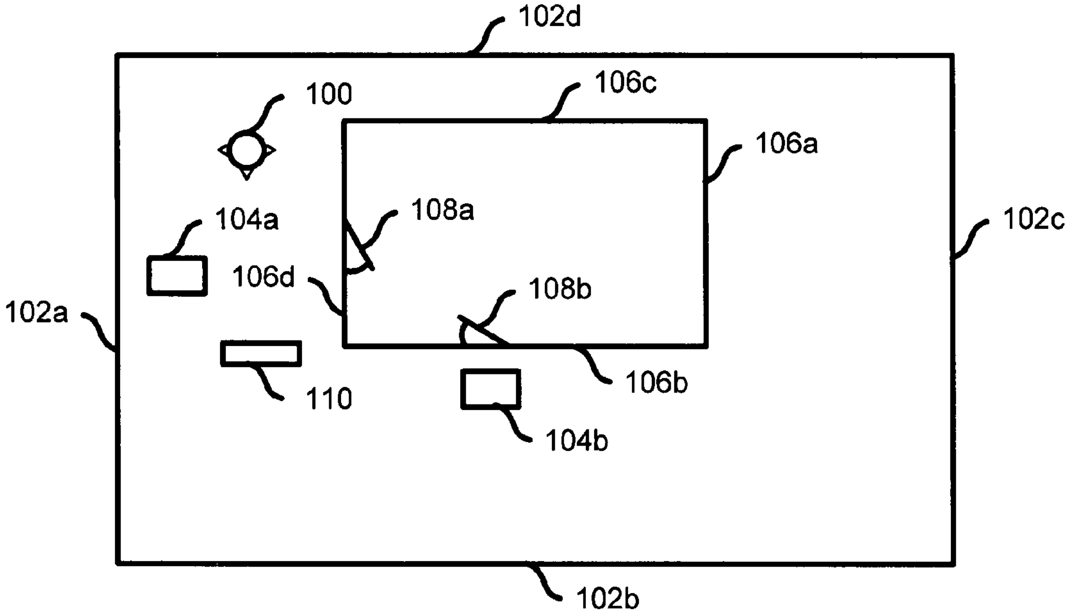
FIG. 1 is a block diagram illustrating a virtual scene in which a listener is located in a virtual environment that includes sound sources.
Figure 2:
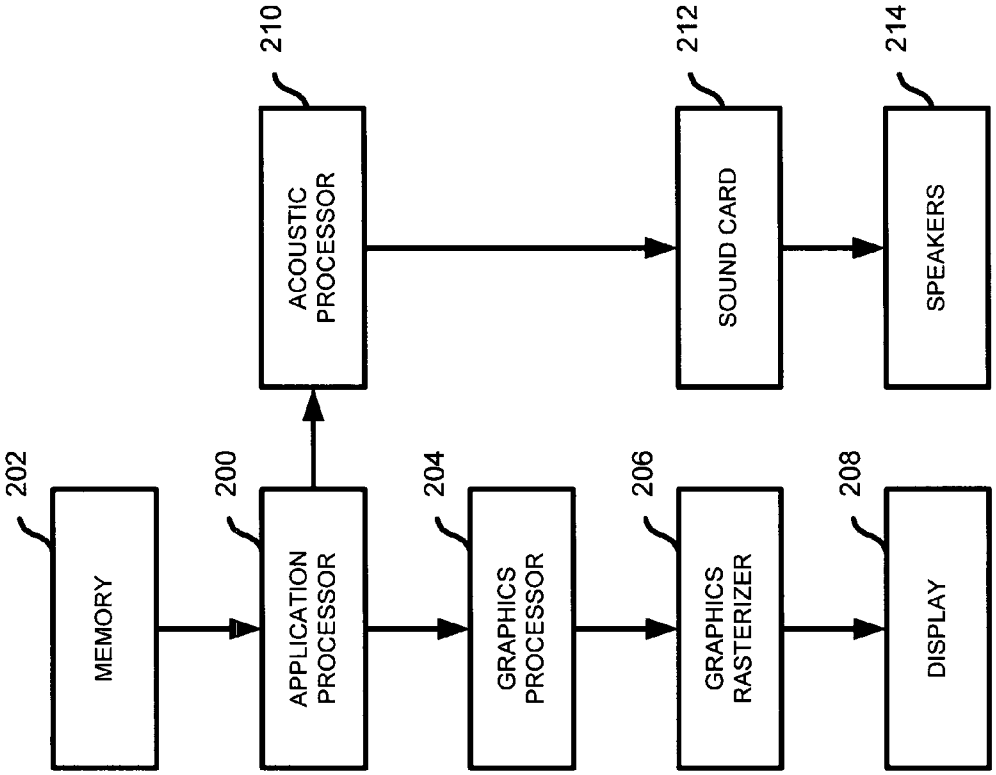
FIG. 2 is a block diagram of a system for rendering a virtual environment such as is shown in FIG. 1 from the perspective of a listener.

FIG. 2 is a block diagram of a system for rendering a virtual environment such as is shown in FIG. 1 from the perspective of a listener. An application processor 200 runs an application or simulation that simulates a virtual environment that includes a listener and various objects which may be rendered both graphically and acoustically. As is well know in the art, graphics programs often render objects as a collection of polygons which are defined by a set of vertices and a normal vector. The vertices and the normal vector uniquely define a polygon in three dimensional space.

The polygons generated by application processor 200 for the purpose of rendering a graphical display are sent to a graphics processor 204 that prepares the polygons for display. A graphics rastorizer 206 performs final processing of the polygons and sends rastorized data to a display 208.

The polygons generated for the graphical display contain detailed information about the physical objects in the virtual environment. The level of detail is greater than that required for acoustically rendering the virtual environment, but it would be extremely useful if the graphical data could be modified and reused for acoustically rendering the environment. To that end, application processor 200 modifies the graphics polygons and sends a modified polygon list to an acoustic processor 210. The modifications to the polygon data are described in detail below and may include eliminating certain polygons, inflating the size of some polygons, organizing polygons into groups which are referred to as lists, and mapping the visual texture of the polygon to an acoustic material type.

Acoustic processor 210 processes the objects in the virtual environment along with the position of various sources and the listener and then creates a play list of sounds that are to be rendered by the various audio signal generators and filters on a sound card 212. Sound card 212 outputs a signal to a set of speakers or headphones 214. Sound card 212 may render 3 dimensional sounds using a variety of techniques including panning, HRTF filters, or ARMA modeling.

It should be noted that application processor 200, acoustic processor 210, and graphics processor 204 may be implemented on separate chips, as, for example, is currently done on some video game console platforms. In addition, the processors may all be implemented on a single processor with procedures that run in a parallel or in serial time division multiplexed fashion. The processors may be implemented on a CPU of a personal computer. The polygon data generated by the application process, which is creating a virtual simulation, is shared by both an acoustic rendering process and a graphics rendering process. This allows a detailed acoustic environment to be rendered efficiently with very little change made to the simulation application that is simulating a virtual environment. That is important because the virtual environment may include a number of interactions with a user and various virtual objects.

Various processes that run in the application processor and the acoustic processor are described below. It should be noted that, in some embodiments, certain of the processes described may be transferred from one processor to the other or split between the two processors. In the description below, for the purpose of clarity, the application processor will be described as the processor that handles a virtual reality simulation and provides polygon data to a visual rendering system and modified polygon data to an acoustic rendering system.

Figure 3:
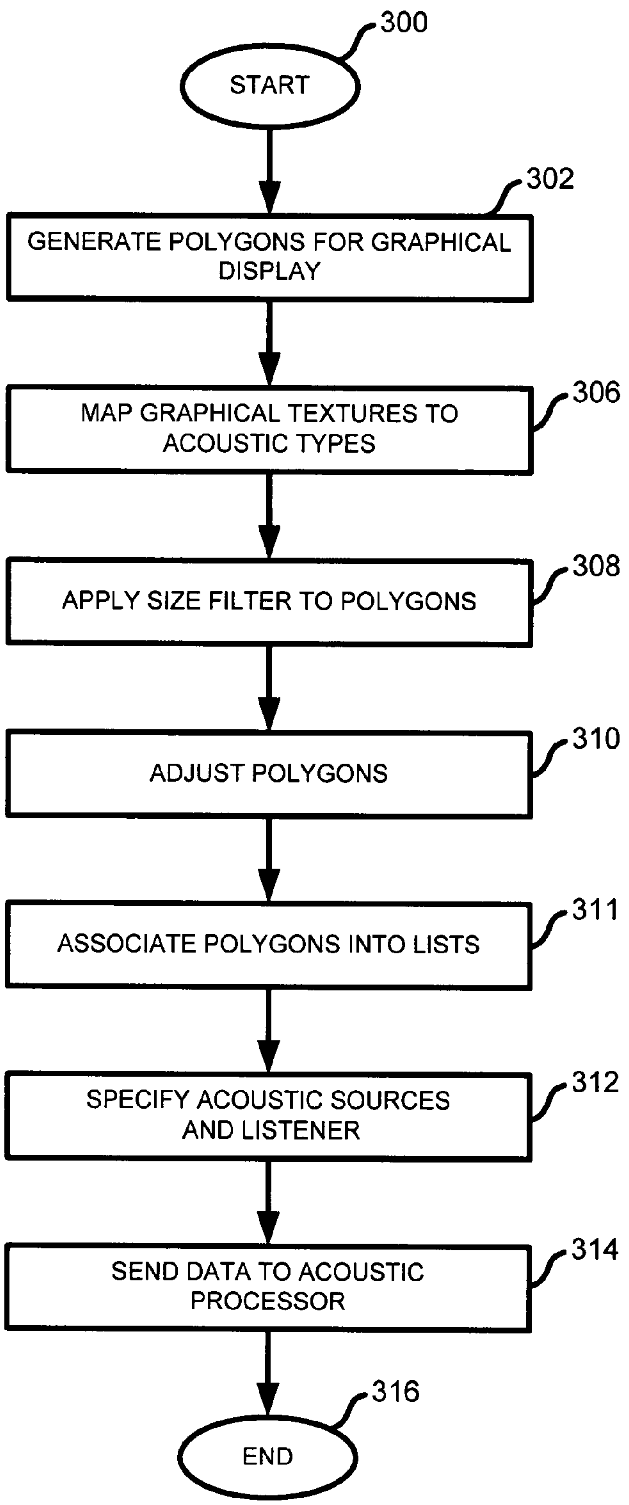
FIG. 3 is a flow chart illustrating a process running on an application processor for preparing polygon data to be sent to an acoustic processor.

FIG. 3 is a flow chart illustrating a process running on an application processor for preparing polygon data to be sent to an acoustic processor. The process starts at 300. In step 302, the application generates polygons for graphic display. As noted above, the polygons may be defined by a set of vertices and a normal vector.

In a step 306, the application processor maps or translates the graphical textures for polygons into acoustic types. The graphical polygons include texture information that determines how the surfaces of the polygons appear when rendered graphically. A table or index is provided that maps each graphical texture to the acoustical material type assigned to that texture. The acoustical material type may correspond to an attenuation factor applied when a polygon of that type occludes a source from a listener and a reflection factor applied when the polygon reflects a sound towards a listener. Thus, the texture data used for graphics is reused to determine the acoustic properties of the polygon by mapping the graphical textures to associated acoustic material types.

In a step 308, the application processor applies a size filter to the polygons. The size filter discards small polygons that are not likely to have a significant acoustic effect on the listener. As long as small polygons correspond to small objects, they do not tend to be acoustically significant because sounds are not significantly attenuated by the presence or absence small objects. Sounds from sources tend to defract around small objects. Likewise, reflections of sounds from small polygons are likely to be insignificant in many cases.

The presence or absence of a small polygon that is part of a larger wall, however, may be more significant. For example, in one embodiment, the occlusion algorithm used by the acoustic processor checks whether a ray from the sound source to the listener passes through a polygon. If such a ray passes through a hole in a larger wall created by the absence of a small polygon, then the attenuation of the sound that should have occurred on the way to the listener might be skipped.

In one embodiment, different size filters are defined for reflections and occlusions. A smaller threshold is specified for occlusions so that fewer polygons are skipped and spurious holes in objects are not created. A rendering mode is specified for individual polygons or groups of polygons that determines whether each polygon is considered for occlusion or reflection determinations. The higher size threshold for reflections avoids expensive reflection processing that is not needed.

Significant gaps may be created when the reflection filtering threshold is large. To compensate for such gaps, large polygons that pass through the size filter may be "bloated" or resized to increase their size by a slight amount to overlap areas covered by smaller polygons that did not reach the size threshold implemented by the filter.

The apparent size of large polygons for reflection processing is increased by different techniques in different embodiments. In one embodiment, the apparent size of the polygons is increased by moving a virtual reflected image of the reflected polygon a bit closer to the source when reflections are calculated as described below. This causes the polygon to appear as if it were a bit larger. In other embodiments, the criteria for determining whether a reflection occurs may be relaxed in a manner that causes the larger polygons to reflect more rays back to the listener.

Applying a size filter to the polygons is an effective way to decrease the number of polygons that must be considered for acoustic rendering and simplify the acoustic rendering process. The threshold size of a polygon that is filtered may be adjusted in a given system to optimize the simplification of the audio processing versus the reduction in quality because of omitted polygons.

In a step 310, the remaining polygons may be adjusted in a manner that further simplifies audio processing of the polygons. In one embodiment, polygons that are very close together and that face nearly the same direction may be combined into a single larger polygon for the purpose of simplifying processing.

In a step 311, certain of the polygons are associated into lists. As is described below in connection with FIGS. 11A and 11B, the lists of polygons are generated for the purpose of grouping polygons together and also for the purpose of designating certain groups of polygons to be cached after they are transformed for the purpose of saving processing resources.

In one embodiment, the list of polygons are selected to include objects that do not move for several frames so that the cached transformed polygons may be repeatedly reused. In some embodiments, polygons may be grouped into a list even though they are moving. When polygons are grouped in a list, a bounding volume may be defined for the list that defines a space in which all of the polygons are included. When occlusion calculations are made for a source, the bounding volumes may first be checked to determine whether it would occlude the source and, if the bounding volume does not occlude the source, then all of the polygons in the list corresponding to the bounding volumes may be skipped when occlusions are checked.

Thus, the association of certain polygons into lists speeds up the acoustical processing of the polygons by allowing the results of certain coordinate transformations to be stored and reused and by eliminating occlusion checks for certain polygons. Complex graphical data can thus be simplified for the purpose of audio processing without requiring separate data to be generated and without requiring significant modification of the application. The application need only group associated objects into lists and designate some or all of such lists as lists that are to be cached.

In a step 312, the application processor specifies the location and power of one or more acoustic sources and also specifies the position of a listener in the virtual environment. The frame data is sent to an acoustic processor in step 314 and the process ends at 316. In one embodiment, the data is sent by the application processor to the acoustic processor on the fly, that is, the data is sent as it is calculated by the application processor and not stored in a frame buffer that is only flushed once an entire frame is sent. In that case, a coordinate transform processor may send its data to a buffer that waits until an entire frame is completed before its data is sent to an acoustic modeling processor. The order of data flow and the location of data buffers may be adjusted in different embodiments for specific data and specific systems.

Figure 4A:
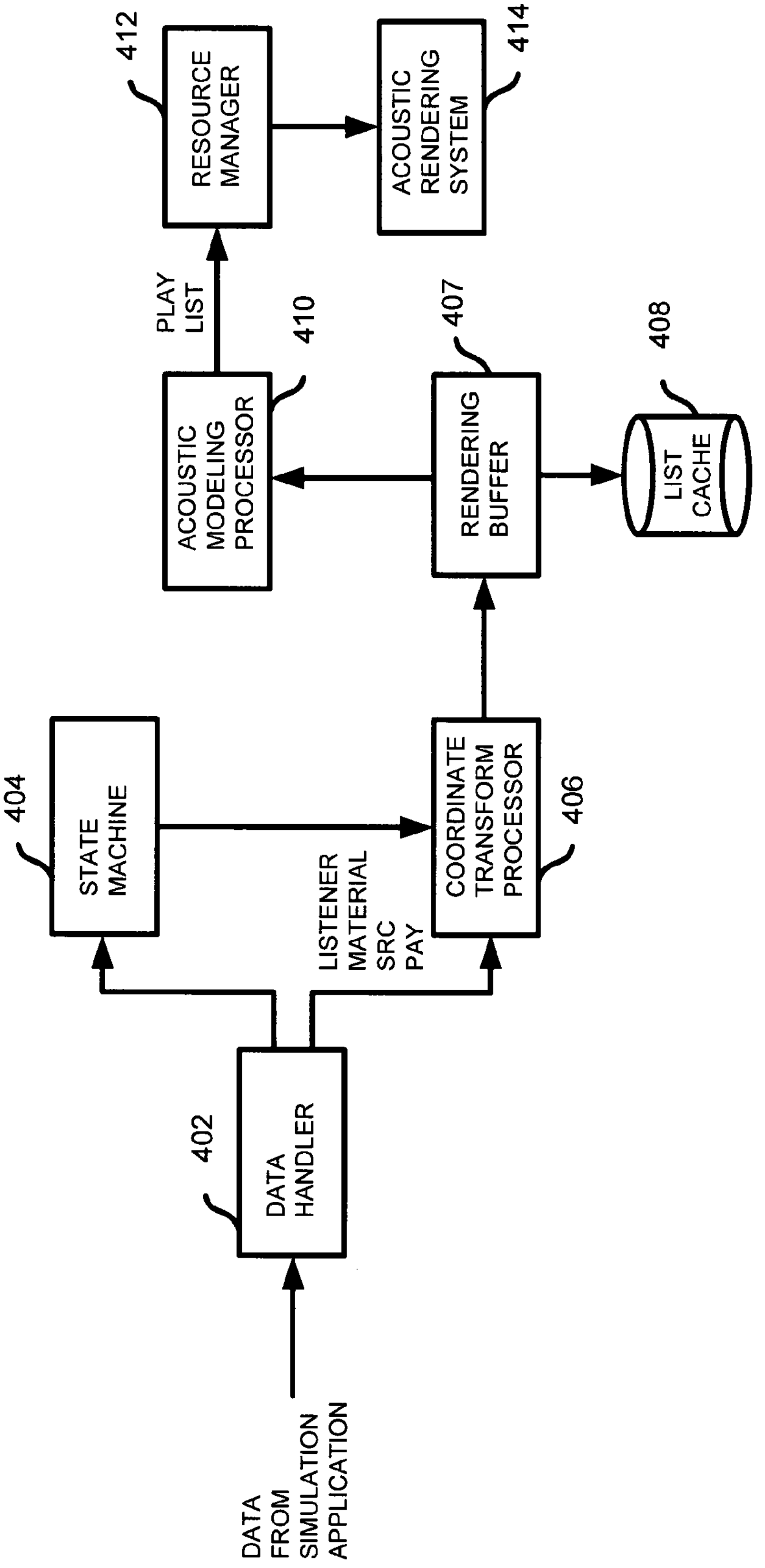
FIG. 4A is a block diagram of a sound processing system that receives data from an application processor and renders the data through a pair of speakers.
Figure 4B:
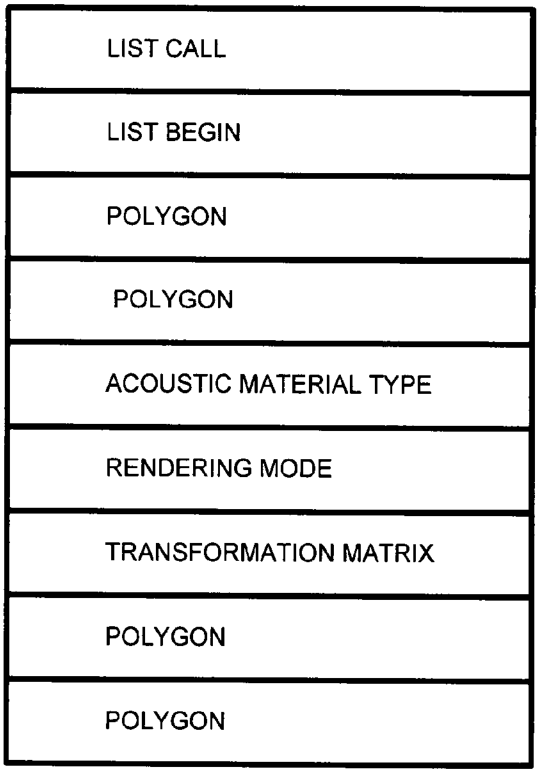
FIG. 4B is a diagram illustrating a portion of a stream of data that may be received by the data handler.

FIG. 4A is a block diagram of a sound processing system that receives data from an application processor and renders the data through a pair of speakers. A data handler 402 receives data from the application processor. The format in which data is received in one embodiment is illustrated in FIG. 4B. Data may be received as a list of polygons that include the polygon vertices and a normal vector as well as certain state information such as acoustic material type that may be sent with each individual polygon. In addition, generalized state variables may be sent in the list of polygons that apply to more than one polygon in the list.

Using acoustic material type as an example, the data stream may include an acoustic material type that is intended to apply to all of the immediately following polygons until a different acoustic material type is specified. Using this technique, it is possible to efficiently specify a common acoustic material type for a number of polygons. In one embodiment, acoustic material type, a coordinate transformation matrix, and rendering mode are included as state variables within the data stream so that they do not need be specified along with each polygon.

Data handler 402 sorts through the data received and determines whether each element corresponds to an object such as a polygon, a listener, or a source, or to a state that affects multiple objects. State updates are sent to a state machine 404 and objects are sent to a coordinate transform processor 406. Coordinate transform processor 406 performs the coordinate transformation specified in the transformation matrices and assembles each polygon into a data structure that is stored in a rendering buffer 407. Sources and the listener position are also sent to the rendering buffer. State machine 404 helps determine various information that is stored along with each polygon in the rendering buffer. Returning the example of acoustic material type, the state machine keeps track of which acoustic material type is to be stored along with each polygon.

Rendering buffer 407 is also connected to a list cache 408 so that when a list is specified in the incoming data, the list may be cached and when such a list is referenced in incoming data, that list may be sent to an acoustic modeling processor along with the rest of the information stored in the buffer. As mentioned above, the buffer may store an entire frame of objects and send them to acoustic modeling processor 410 only when a frame is finished being stored in the buffer. Acoustic modeling processor 410 processes the sounds from the sources based on the location of the sources relative to the listener as well as the objects in the acoustic environment defined by the polygons received from the rendering buffer.

For example, a source that reflects off of a polygon once generates in the play list two sounds generated at two different locations relative to the listener. One sound corresponds to the direct path and the second sound corresponds to the reflection off of the polygon. The second sound is delayed by an amount corresponding to the extra path length traveled by the reflected sound and the reflected sound has an intensity corresponding to the amount of reflected sound energy. It should be noted that in this specification the terms strength and intensity are used generally to represent the intensity, energy, or loudness of a sound source. It should be understood that, whenever the strength, intensity or energy of a sound source is mentioned as being adjusted or specified, the sound source may be defined by any appropriate measure that determines loudness of the source as perceived by the listener.

The play list is sent from acoustic modeling processor 410 to a resource manager 412. Resource manager 412 determines the sounds in the play list that are most important to be rendered by an acoustic rendering system 414. Since acoustic rendering system 414 has a finite amount of resources to render sounds, the resource manager selects the most significant sounds for rendering. The selection is made in one embodiment by selecting the most intense sounds in the play list. Acoustic rendering system 414 may render the sound in a location relative to the listener using various techniques including panning and HRTF filters.

FIG. 4B is a diagram illustrating a portion of a stream of data that may be received by the data handler. The stream of data includes a list call 430 which specifies that a list of polygons is to be retrieved by the rendering buffer and sent to the acoustic rendering processor. A beginning of list marker 432 specifies that a list of polygons is about to be sent. The list includes a polygon 434 and a polygon 436. An end of list marker 438 marks the end of the list. An acoustic material type variable 440 is also included.

A rendering mode variable 442 is also sent that enables or disables reflections or occlusions. The data stream also includes a matrix specification 444 and a polygon 446 that is not part of a list and another polygon 448 that is also not part of a list. As noted above, in different embodiments, various state variables may be either included in the data stream separate from polygons or included as part of the specification of a polygon in different embodiments.

Figure 4C:
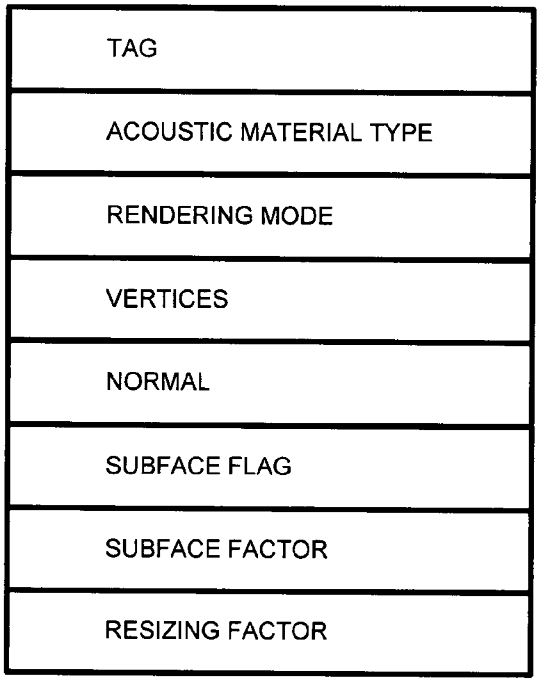
FIG. 4C is a diagram illustrating a format for a polygon specification sent from coordinate transform processor 406 to rendering buffer 407.

FIG. 4C is a diagram illustrating a format for a polygon specification sent from coordinate transform processor 406 to rendering buffer 407. The polygon specification includes a tag 460 that identifies the polygon. The purpose of identifying the polygon is described below in conjunction with FIG. 10. An acoustic material type field 462 identifies the acoustic material so that the reflective and absorptive properties of the material may be considered in the model. A rendering mode field 464 specifies whether occlusions or reflections or both are to be calculated for the polygon. The rendering mode may be set for certain polygons by the size filter described above. For example some small polygons may have a rendering mode that requires occlusions to be processed but not reflections. It should be noted that in some embodiments, the rendering mode is specified universally for all of the polygons in a buffer or for a set of polygons and is not included in every polygon object sent to the rendering buffer. In general, various state information may be specified either for polygons individually or for sets of polygons.

A vertices field 466 specifies the vertices of the polygon. A normal field 468 specifies the normal of the polygon. A subface flag 470 specifies whether the polygon has a subface. If the subface flag is set, then a subface factor 472 is also included. The purpose of a subface is described further in connection with FIG. 7B. A resize factor field 474 specifies whether the polygon is to be resized for the purpose of calculating reflections. Again, it should be noted that the resizing policy may be universally specified for a set of polygons and may not necessarily be included in individual polygon specifications.

Figure 5A:
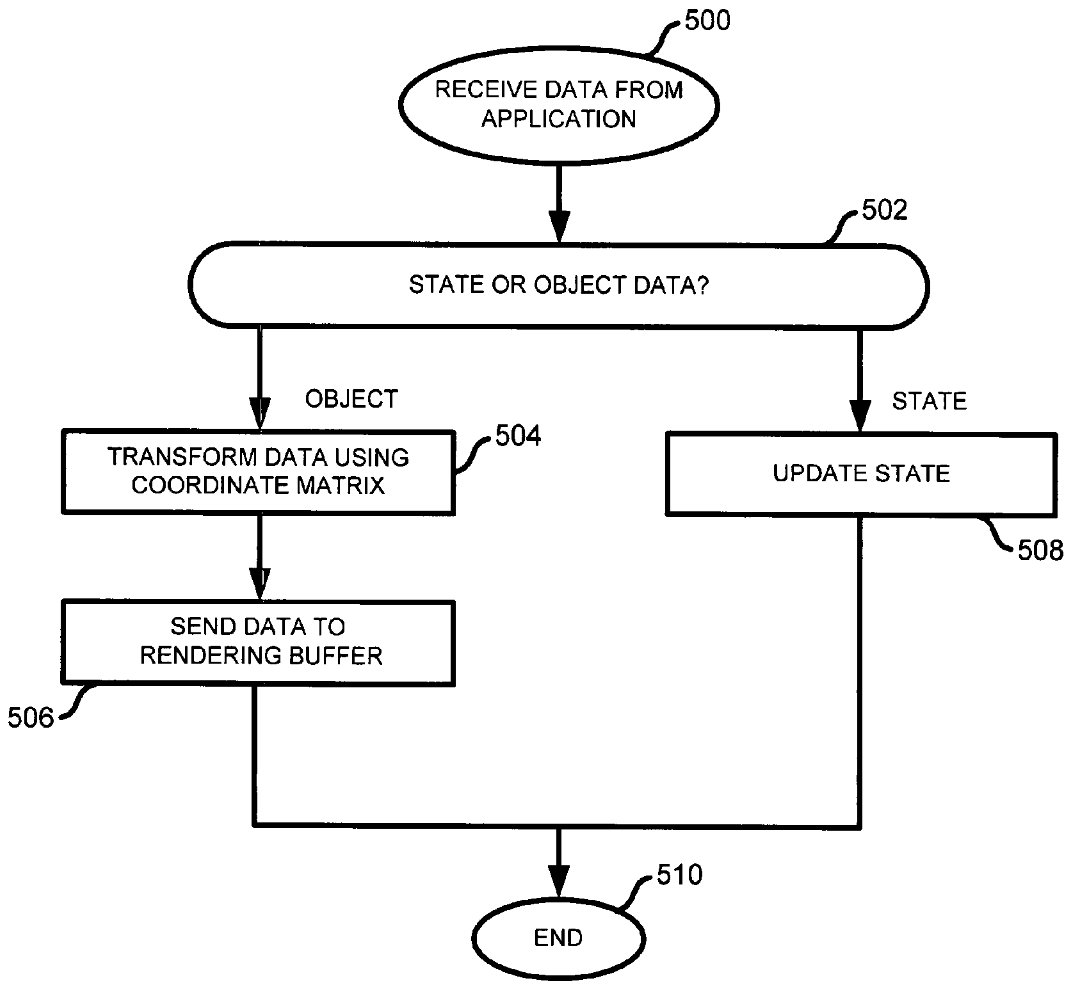
FIG. 5A is a flowchart illustrating a process implemented on the data handler and the coordinate transformation processor.

FIG. 5A is a flowchart illustrating a process implemented on the data handler and the coordinate transformation processor. The process begins at 500 when data is received from an application. The data handler determines whether the data is state data that is to modify a number of objects or object data that corresponds to a polygon or a source that is being rendered or the listener. If the data is state data, then the state is updated in a step 508. If the data is object data, then the coordinate transform processor transforms the data using the coordinate matrix in a step 504 and sends the data to a rendering buffer in a step 506. The process then ends at 510.

Figure 5B:
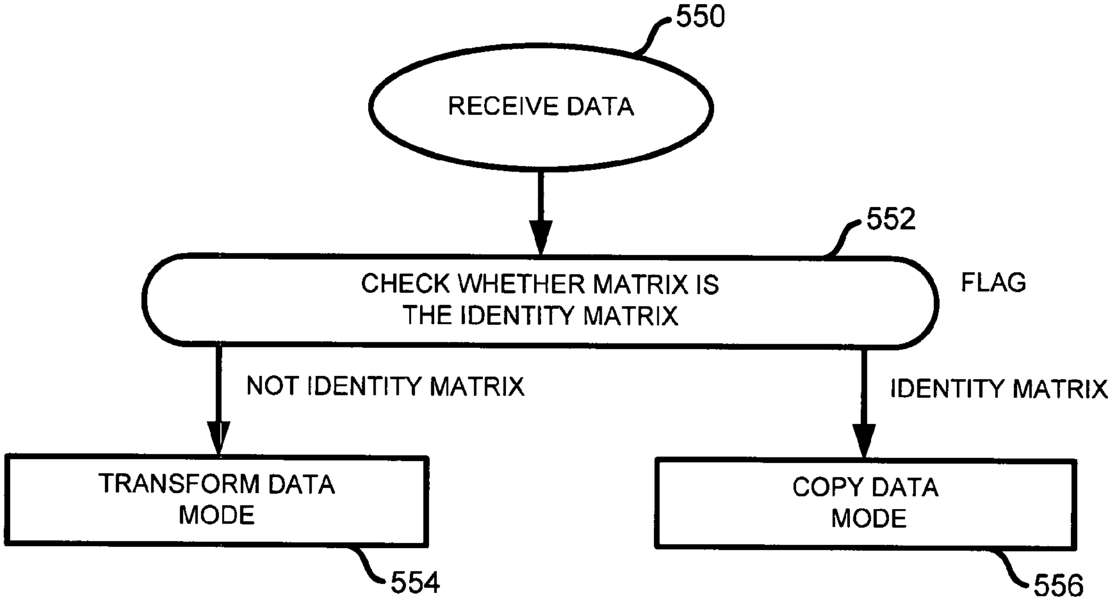
FIG. 5B is a flowchart illustrating a process that runs when matrix data is received.

FIG. 5B is a flowchart illustrating a process that runs when matrix data is received. The process starts at 550 when data is received. In a step 552, it is determined whether the matrix received is the identity matrix. If the matrix is not the identity matrix, then control is transferred to a step 554 and the coordinate transformation processor is placed in a mode where it transforms the coordinates that it receives. If the matrix is the identity matrix, then control is transferred to a step 552 to a step 556 and the coordinate transformation processor is put in data copy mode, that is, coordinates are not transformed but are simply copied or left alone. Skipping the transformation of coordinates when the transformation matrix is the identity matrix speeds up processing and saves resources.

Figure 6:
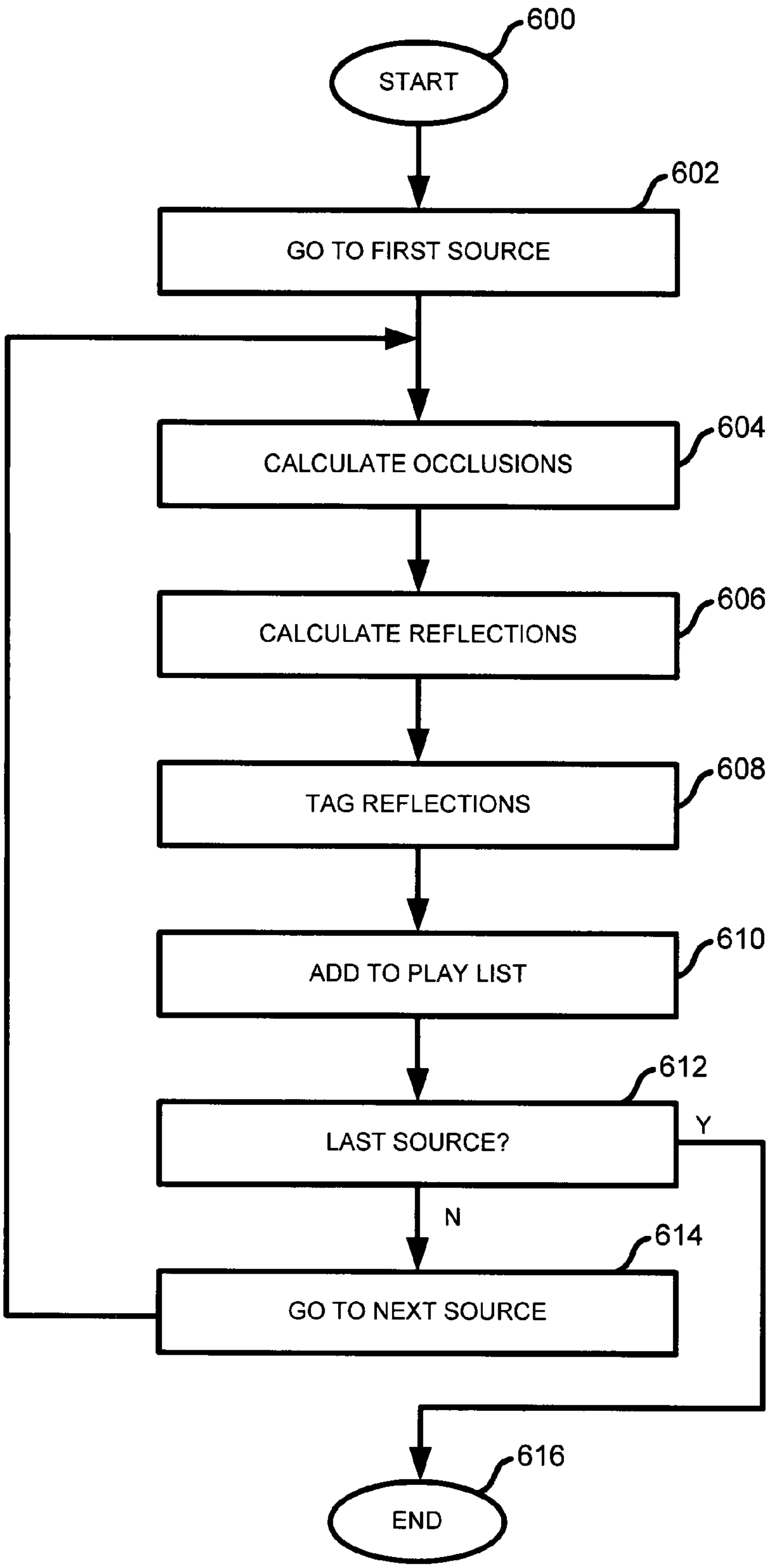
FIG. 6 is a flowchart illustrating a process running on the acoustic modeling processor for generating a play list of sounds to be sent to the resource manager.

FIG. 6 is a flow chart illustrating a process running on the acoustic modeling processor for generating a play list of sounds to be sent to the resource manager. The process starts at 600 when the acoustic modeling processor receives a list of sources, polygons, and a listener location for a frame from the rendering buffer. In a step 602, the acoustic modeling processor begins to calculate reflections and occlusions for the first source. In a step 604, occlusions are calculated. Calculating occlusions is described further FIGS. 7A-7C. Next, in a step 606, reflections are calculated for the polygons. Several techniques have been developed for speeding up the calculation of reflections.

First, reflections are not be calculated for every frame. In one embodiment, a counter is used to count frames and reflections are only calculated for every nth frame. Thus, the frequency of updates for reflected sounds is less than the frequency of updates for occlusions. This policy is desirable because latency in reflection position updates are not as noticeable to a listener. In a graphic system, the frame rate may vary and may be faster than is required for audio updates. In one embodiment, updates from the application are limited to 30 updates per second for the audio system and occlusions are calculated for every update, but reflections are only calculated only for every 4th update.

Figure 8A:
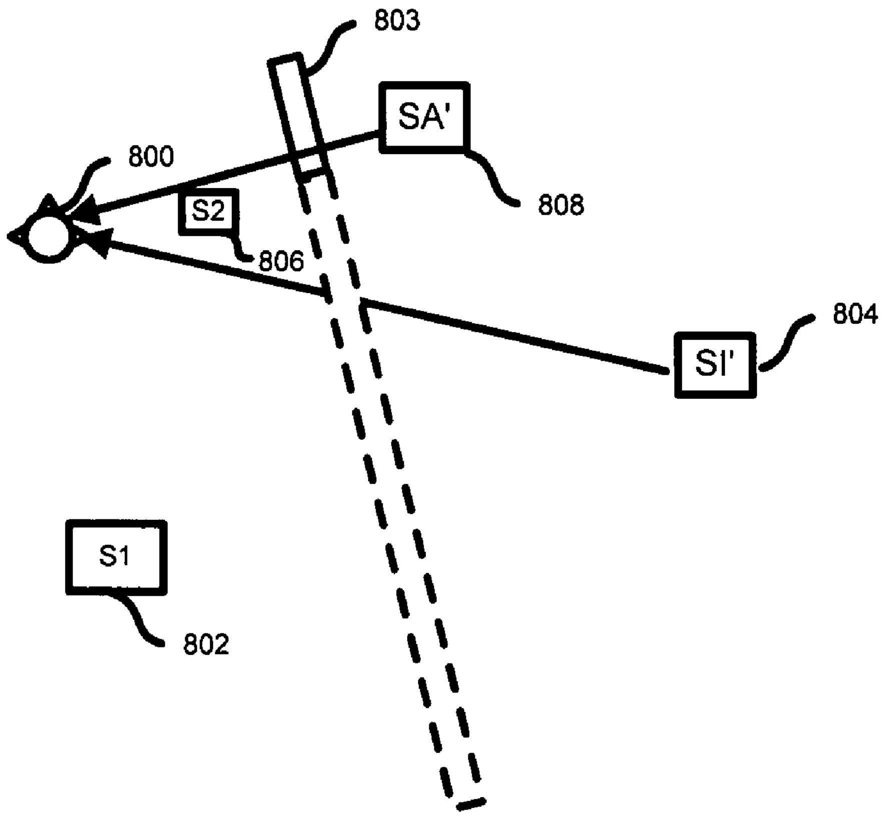
FIG. 8A is a diagram illustrating a method of determining whether a reflection from a polygon should be rendered.
Figure 8B:
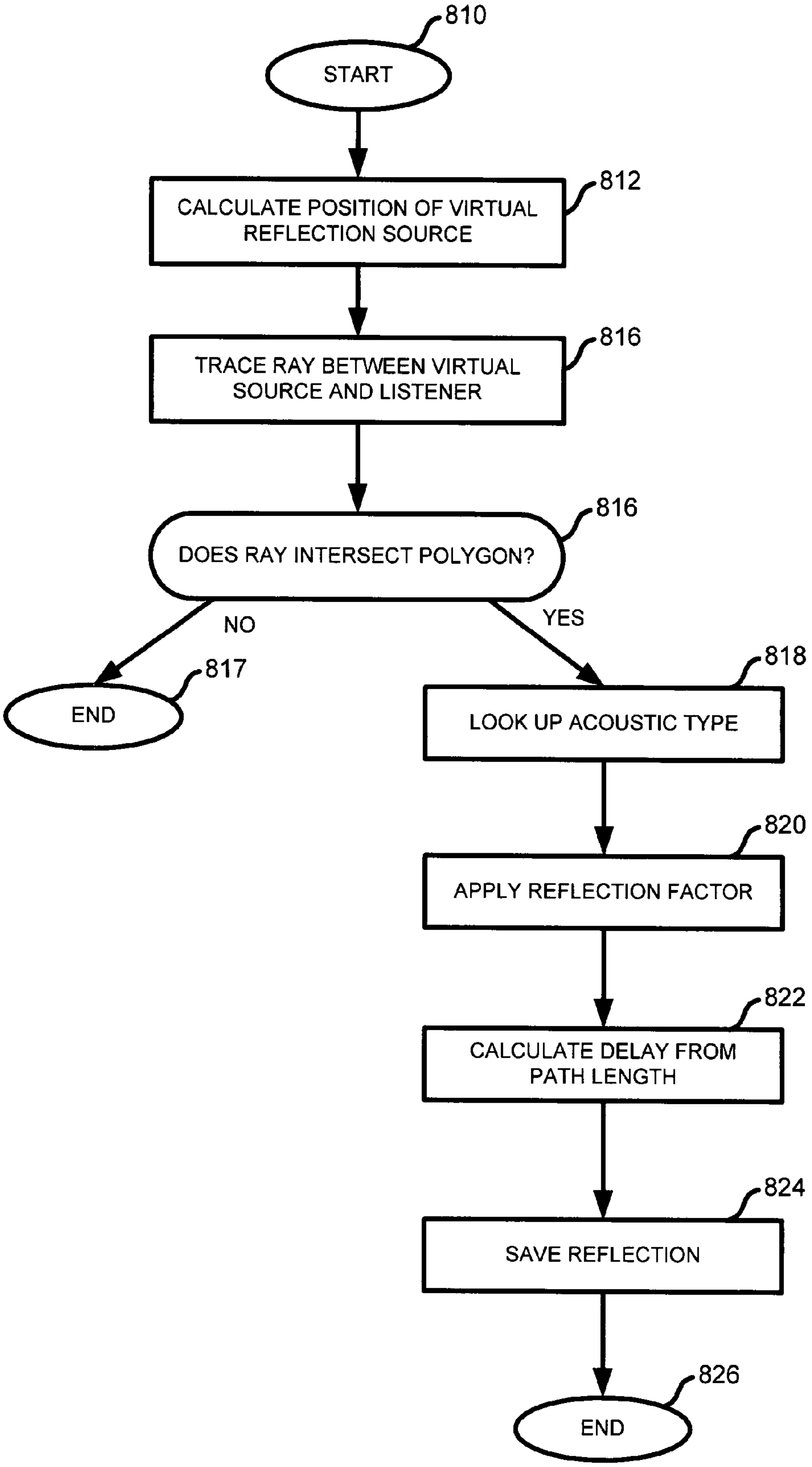
FIG. 8B is a flowchart illustrating the process for calculating reflections. The process starts at 810.

The process for calculating reflections is further detailed in FIGS. 8A and 8B. A process for speedily calculating second order reflections is detailed in FIG. 9. In a step 608, the tag that identifies the polygon that caused the reflection is added to the description of the reflection and the reflection is added to the play list in a step 610. The format for items added to the play list varies, depending on the type of acoustic rendering system. In general, for each sound source, be it an original source or a reflecting source, an intensity and a direction are specified, as well as a delay for playing the sound. These parameters may be specified by filter parameters or by any other method of specifying sound information to a sound card that includes an acoustic rendering system.

In a step 612, the acoustic modeling processor determines whether or not the last source has been rendered. If the last source has not been rendered, then control is transferred to a step 614 and the next source is selected. Control is then transferred to step 604. If the last source has been rendered, then the process ends at 616.

In order for the audio information to be updated at a frame rate on the order of 30 times a second, several techniques have been developed to optimize the processing of occlusions and reflections. Calculation of occlusions will now be described.

Figure 7A:
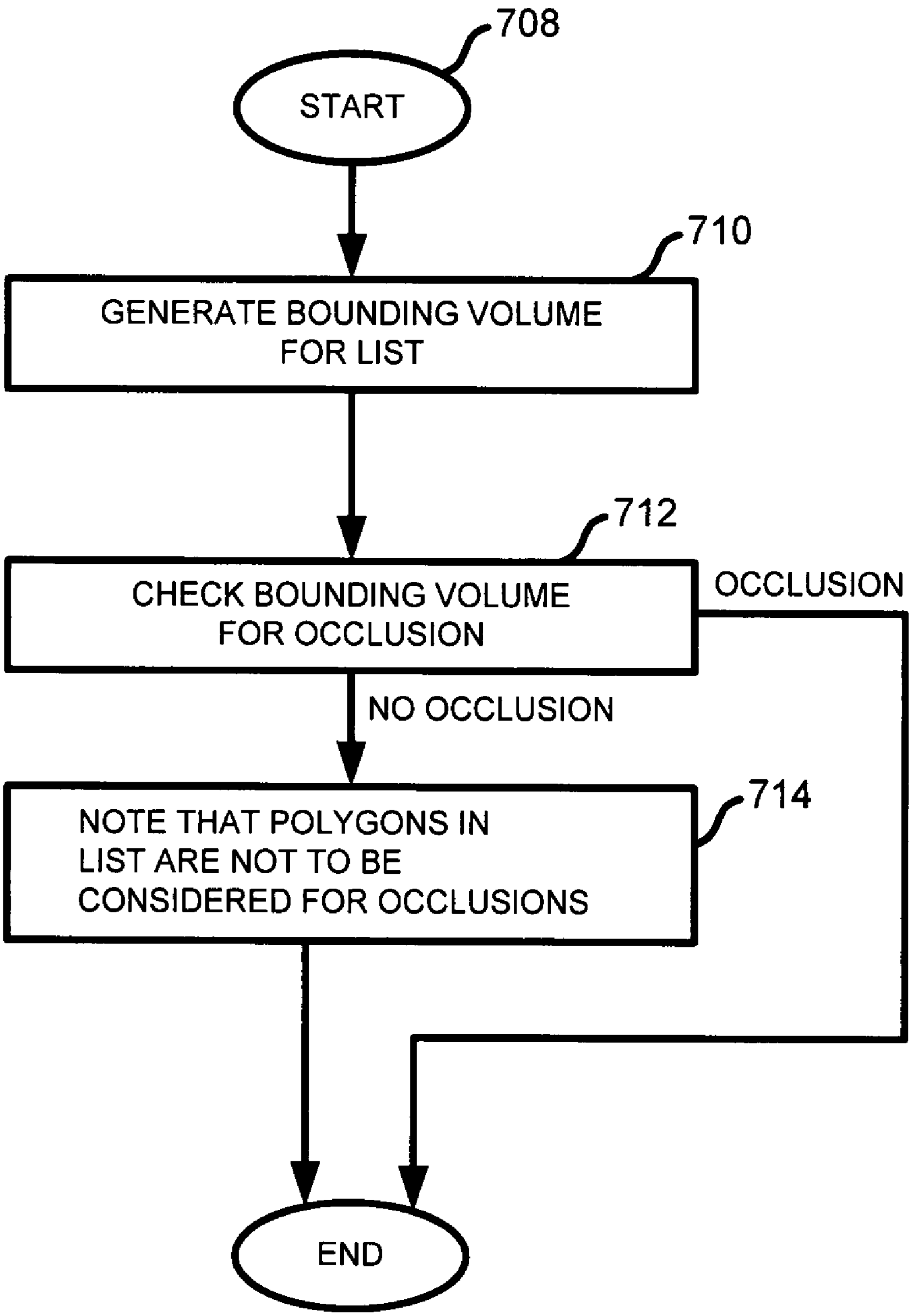
FIG. 7A is a flowchart illustrating a process for checking whether polygons that are part of a list need to be individually checked for occlusions.

FIG. 7A is a flowchart illustrating a process for checking whether polygons that are part of a list need to be individually checked for occlusions. The process starts at 700. In a step 710, a bounding volume is generated for the polygons in the list. The bounding volume is generated by the application and is sent along with the list. In a step 712, it is determined whether the bounding volume itself would occlude the source being considered from the listener. If an occlusion is detected for the bounding volume, then the process ends at 716. If no occlusion is detected, then control is transferred to a step 714 and it is noted that the polygons in the list are not to be considered for occlusions of the source.

In one embodiment, a bounding volume for each list is generated by the application processor and the acoustic modeling processor first checks the bounding volume for the list for the source being considered before checking occlusions for any items in the list. Thus, calculation of the bounding volume and checking for occlusions by the bounding volume may be performed at different stages. If checking is performed in the application, then the sources for which occlusion checking should be skipped are noted for the acoustic modeling processor.

Figure 7B:
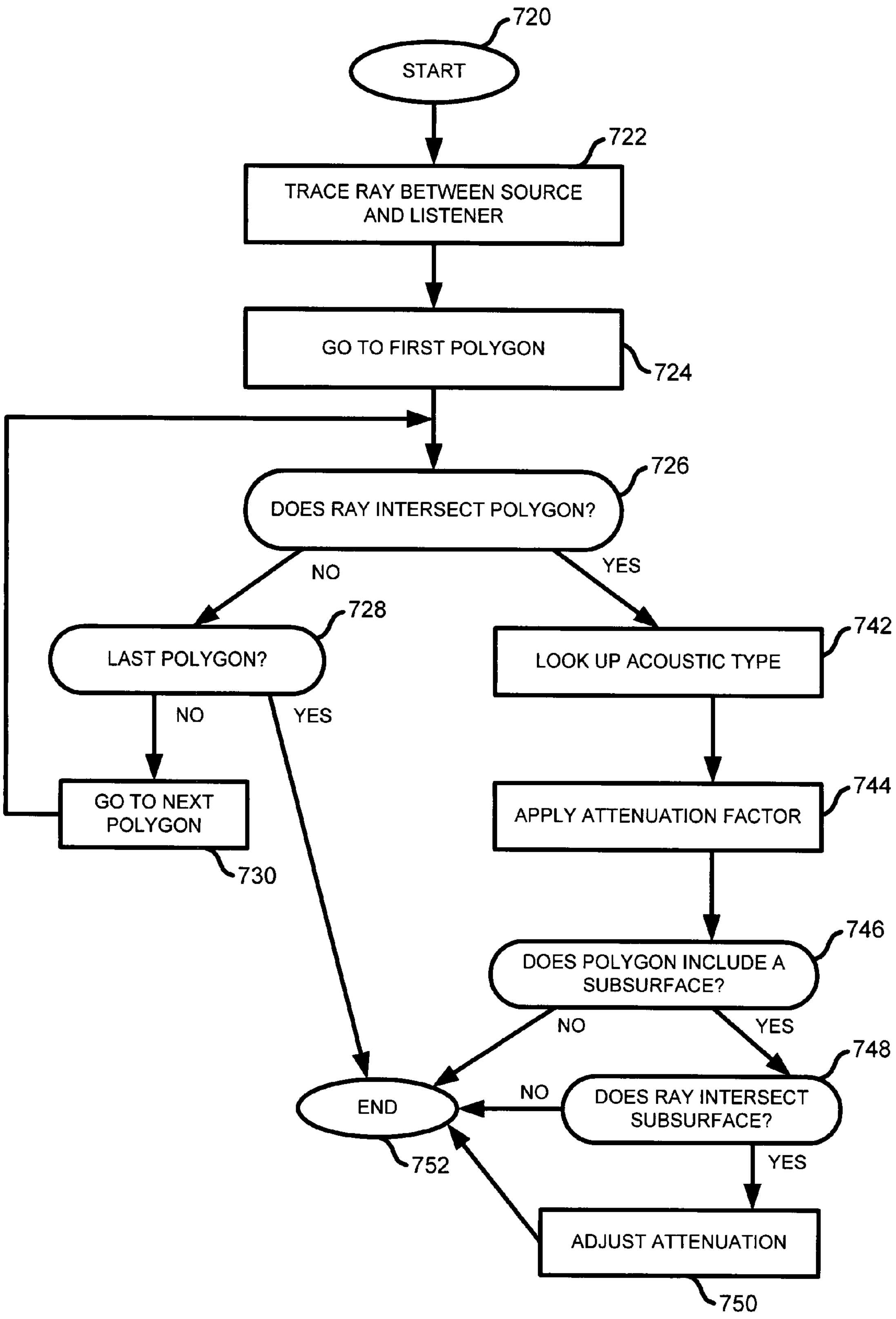
FIG. 7B is a flowchart illustrating a process for calculating occlusions of polygons sent by the rendering buffer for a source and a listener.

FIG. 7B is a flowchart illustrating a process for calculating occlusions of polygons sent by the rendering buffer for a source and a listener. The process starts at 720. In a step 722, a ray is traced between the source and the listener. In a step 724, the first polygon in the list of polygons is selected. In order to speed the calculation of occlusions in one embodiment, the acoustic modeling processor is configured to find the first occlusion and then stop. Thus, sounds are attenuated by at most a single occlusion and once the first occlusion is found, no further occlusions are investigated.

A further optimization is used to order of search of the polygons. When an occlusion is found for a polygon in the previous frame, the occlusion by that polygon is noted and temporarily stored. In the next frame, the first polygons checked are the polygons from the previous frame that caused occlusions of the source. Polygons that occluded the source in the previous frame are likely to continue to occlude the source. Therefore, checking the polygons that occluded the source in the previous frame is likely to detect the same occlusion so that the rest of the polygons need not be searched. The process may be adjusted to change the maximum number of occlusions calculated for each source to be greater than one. Thus, the process may be tuned so that more occlusions can be found at the cost of greater processing time required to check for more occlusions. A maximum number of occlusions is usually set since, after several occlusions, the signal from the source is likely to be so weak that it will become insignificant compared to other sound sources and will not be selected by the resource manager for rendering.

Once the first polygon to be checked has been selected, control is transferred to a step 726 where it is determined whether or not the ray between the source and the listener intersects the polygon. In some embodiments, a flag may be set in the description of the polygon sent to the acoustic modeling processor that indicates that the polygon is to be resized or enlarged. If resizing is indicated, then the polygon is resized before the intersection is checked. If no intersection is detected, control is transferred to a step 728 and the processor checks whether the last polygon has been checked. If the last polygon has not been checked, then the next polygon is selected in a step 730 and control is transferred back to step 726. If the last polygon has been checked, the process ends at 752.

If, in step 726, the ray is determined to intersect the polygon, then control is transferred to a step 742 and the acoustic material type of the polygon is determined. Next, in a step 744, the attenuation factor for that acoustic material type is applied. In a step 746, it is determined whether the polygon includes a subsurface. If the polygon does not include a subsurface, then the process ends at 752. If the polygon does include a subsurface, it is checked in a step 748 whether the ray intersects the subsurface. If the ray does not intersect the subsurface, the process ends at 752. If the ray does intersect the subsurface, then control is transferred to a step 750 and the attenuation of the source by the polygon is adjusted.

The attenuation is adjusted according to a subsurface factor that is stored along with the subsurface. The subsurface factor is adjusted by the application program to indicate whether the subsurface is open or closed. For example, a subsurface may be defined for a door in a wall. The subsurface factor may be adjusted between one and zero to indicate whether the door is open, partially open, or closed. If the subsurface factor is 0, for example, corresponding to a closed door, then the attenuation of the source by the polygon is not adjusted. If the subsurface factor is 1, corresponding to an open door and the ray between the listener and the source intersects the open door, then the attenuation factor may be modified to not attenuate the source at all. Thus, the subsurface is used to cancel or partially cancel the attenuation of a source by a polygon when the subsurface is active. In general, subsurfaces correspond to openings in polygons.

It should be noted that processing of subsurfaces may occur before an attenuation factor is applied. Also, if a subsurface cancels out an attenuation, the occlusion process may be reset to check for other occlusions by other objects. In the embodiments shown, once an occlusion is detected for a first polygon, no further occlusions are investigated. In other embodiments, a counter is incremented when a occlusion is found and a maximum number of occlusions is set.

Figure 7C:
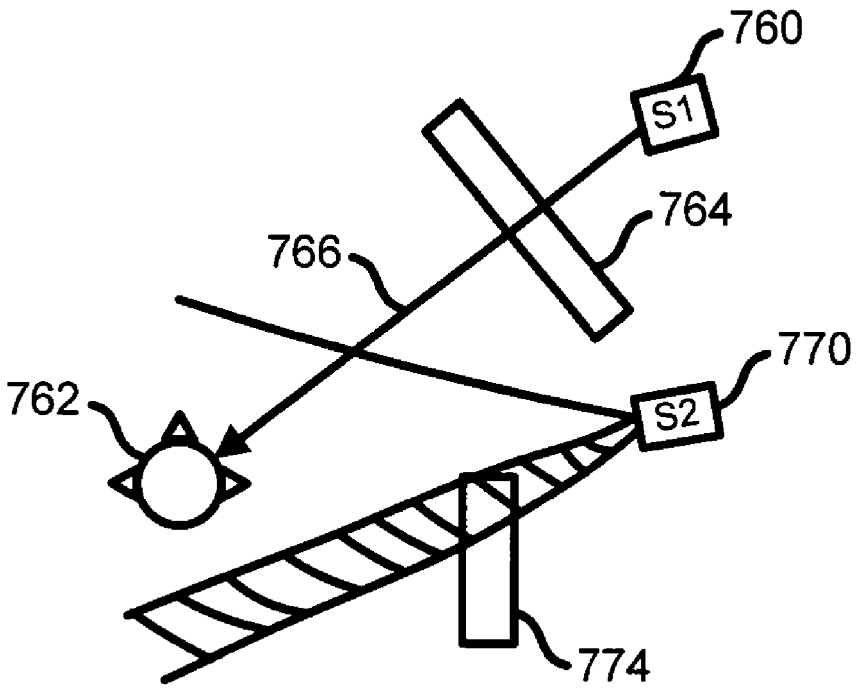
FIG. 7C is a diagram illustrating the detection of an occlusion.

FIG. 7C is a diagram illustrating the detection of an occlusion. A source 760 is occluded from a listener 762 by an object 764. A ray 766 is traced between the listener and source 760. The intersection of ray 766 with object 764, which is rendered using a polygon, is detected and the intensity of source 760 is adjusted according to the attenuation associated with the acoustic material type of the polygon that was intersected.

A more advanced technique for calculating occlusions or partial occlusions is illustrated using source 770 and object 774. Instead of tracing a ray between source 770 and listener 762, a cone is extended from source 770 to listener 762. The portion of the cone that is intersected by an object 774 represented by a polygon is determined. The portion of the cone that is intersected is used to scale the attenuation factor associated with the acoustic material type of object 774 so that when the cone is completely intersected, the attenuation is a maximum amount and the attenuation is reduced when the cone is partially intersected. This advanced technique allows partial occlusions to be accounted for and modeled. The simpler occlusion detecting method of checking for intersection with a single ray is used to speed up the process when that is desired for a given system.

FIG. 8A is a diagram illustrating a method of determining whether a reflection from a polygon should be rendered. A listener 800 is positioned in a virtual environment that includes a source 802, an object 803 represented by a polygon, and a source 806. Reflections are determined by extending polygon 803 into an infinite plane. A virtual source is reflected on the other side of the plane for each real source included in the environment. In the example shown, virtual source 808 is the reflection of source 806 and virtual source 804 is the reflection of source 802. A ray is then traced between each of the virtual sources and the listener.

It is determined whether each ray intersects the polygon that was used to generate the virtual source from which the ray emanated. It should be noted that, once the virtual sources are determined, this process is the same as the general occlusion process described above and may be executed by a common subroutine used for calculating occlusions. In the example shown, the ray from virtual source 808 does intersect object 806 and the ray from virtual source 804 does not intersect object 802. Therefore, a reflection is calculated for source 806 and no reflection is calculated for source 802. Reflections result in an additional sound being generated for the play list. The source location of the sound is the location of the virtual source and the delay of the sound is calculated using the distance from the virtual source to the listener. Using this simple method, reflections may be found and calculated quickly.

FIG. 8B is a flowchart illustrating the process for calculating reflections. The process starts at 810. In a step 812, the position of the virtual reflection source is calculated relative to the listener. In a step 814, a ray is traced between the virtual source and the listener. In a step 816, it is determined whether the ray intersects the polygon being considered. If the ray does not intersect the polygon, then the process ends at 817. If the ray does intersect the polygon, then control is transferred to a step 818 and the acoustic material type of the polygons is determined.

In a step 820, the reflection factor for the material type is applied to determine the strength of the reflection. The length of the ray between the virtual source and the listener is also used to attenuate the sound. In a step 822, the pathway between the virtual source and the listener is used to calculate a delay for the reflection. In a step 824, the reflected sound is saved so that it can be added to the play list. The process ends at 826.

Figure 9A:
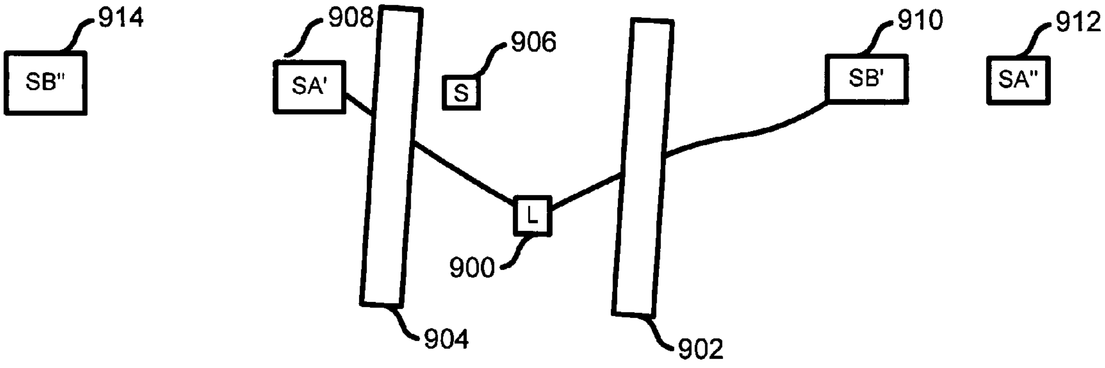
FIG. 9A is a diagram illustrating how second order reflections are calculated from first order reflections in one embodiment.

FIG. 9A is a diagram illustrating how second order reflections are calculated from first order reflections in one embodiment. A listener 900 is in a virtual environment that includes a polygon 902 and a polygon 904. A source 906 is also included in the virtual environment. As a result of a primary reflection off of polygon 904, a virtual source 908 is included in the list of reflections generated by the acoustic modeling processor. As a result of a first order reflection off of polygon 902, a virtual source 910 is also included in the list of reflections generated by the acoustic modeling processor. In addition to these first order reflections which result from a single reflection from a polygon to the listener, second order reflections also occur.

For example, sound from source 906 will bounce off of polygon 904 and then bounce off of polygon 902 and reach listener 900. The sound for this second order reflection is rendered in addition to the sound from the first order reflections off of polygon 904 and polygon 902 and sound traveling the direct path between source 906 and listener 900. Calculating whether or not a reflection would occur for every virtual source such as virtual source 912 that corresponds to the above described path would consume a large amount of processing resources.

As an alternative to calculating all such reflections, an alternative scheme is implemented. All first order reflections are first calculated. In examples shown, the first order reflection corresponding to virtual source 908 and the first order reflection corresponding to virtual source 910 are calculated. Next, the rays extending from the two virtual sources to the listener are compared and the angle difference between the two vectors is determined. A threshold is applied to the angle difference and any difference that has an absolute value greater than the threshold is processed for a secondary reflection. In one embodiment, the threshold difference is 90 degrees.

In the example shown, the ray between virtual source 908 and listener 900 and the ray between virtual source 910 and listener 900 have an angular difference between them of greater than 90 degrees. As a result, secondary reflections are generated. The secondary reflection is generated by reflecting virtual source 908 across polygon 902 to create a secondary reflection virtual source 912. Likewise, a secondary reflection is created by reflecting virtual source 910 across polygon 904 to create a secondary virtual source 914.

Secondary virtual source 912 corresponds to the reflection of the source first off of polygon 904 and then off of polygon 902. Secondary virtual source 914 corresponds to the reflection of the source first off of surface 902 and then off of surface 904. The two second order virtual sources define the positions from which the second order reflection sounds are generated and the acoustic material type reflecting properties of the two polygons are used to determine how much the sound from the source is attenuated when the reflections occur.

An additional attenuation factor is also derived to account for the fact that the second order of reflections will be weaker when the angles of the reflections are not normal angles. In one embodiment, the absolute value of the cosine of the angle between the two first order rays is used as a multiplicative reflection factor for the second order reflections. That is, the strength of the second order reflection based on the distance of the second order virtual source and the acoustic material types of the polygons is multiplied by the absolute value of the cosine of the angle between the two rays.

If the two rays are 180 degrees apart, corresponding to normal reflections with both polygons in opposite directions, then the reflection factor is at a maximum and the second order reflections are attenuated the least. As the angle becomes smaller than 180 degrees, then the reflection factor decreases and the attenuation of the second order reflections is increased. In other embodiments, other functions may be used to attenuate the second order reflections. For example, the square of the cosine could be used or other functions which increase with the obliqueness of the angle between the two first order reflection rays.

Figure 9B:
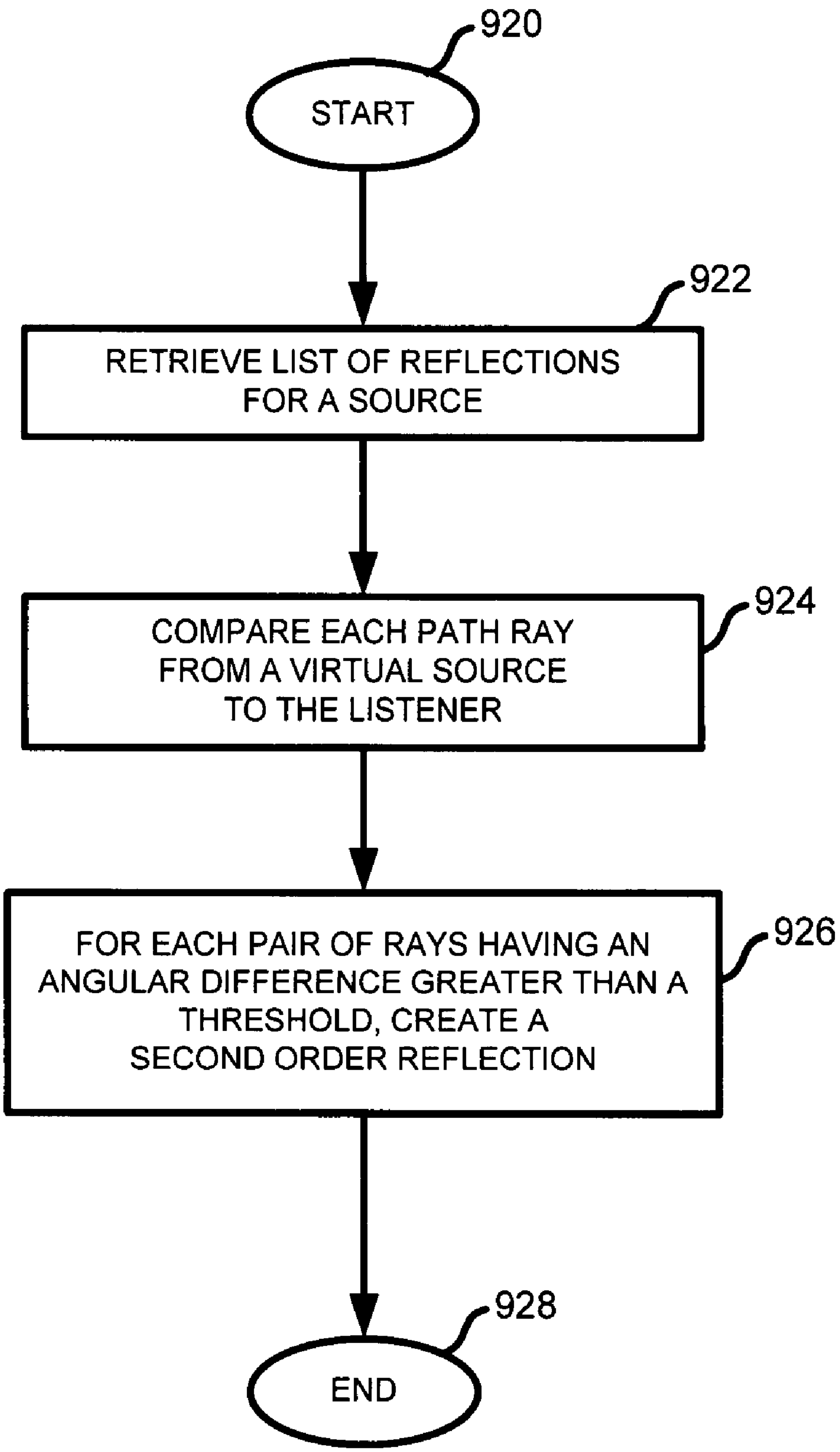
FIG. 9B is a flow chart illustrating a process for calculating the second order reflections.

FIG. 9B is a flow chart illustrating a process for calculating the second order reflections. The process starts at 920. In a step 922, the acoustic modeling processor retrieves a list of reflections for a source. In a step 924, the acoustic modeling processor compares each path ray corresponding to a first order reflection from a virtual source to the listener. In a step 926, a second order reflection is created for each pair of rays that have an angular difference greater than a threshold. Each second order reflection is created by reflecting the first order virtual sources across the polygon that corresponds to the other first order ray that caused the angular difference threshold to be exceeded.

The intensity of the second order reflection is determined by the distance from the second order virtual source to the listener, the acoustic material types of the two polygons that produced the second order reflection, and a second order reflection factor that is derived from the angular difference between the two rays from the first order reflections. As described above, the second order reflection factor may be the absolute value of the cosine of the angle between the two first order reflection rays. Thus, occlusions, first order reflections and second order reflections may be efficiently calculated for a virtual acoustic environment using the techniques described above.

When reflections are rendered as virtual sources in different frames and separate play lists sent to the resource manager, it is possible that different channels in the acoustic rendering systems will be used to render the same virtual source. In some acoustic rendering systems a smoothing function is included between frames for each channel so that sounds do not appear to jump around in an unnatural fashion. It would be desirable if sounds from a first order reflection off of the same polygon in different frames could be smoothed but first order reflections from different polygons in different frames would not be smoothed.

In order for reflections from the same polygon in different frames to be smoothed, the sound from the virtual source should be rendered using the same channel in the two frames. In order to prevent reflections from different polygons from being smoothed when they are rendered by the same channel, a method of identifying reflections from different polygons is needed. The tags sent with the polygons to the coordinate transformation processor is used for this purpose.

Figure 10:
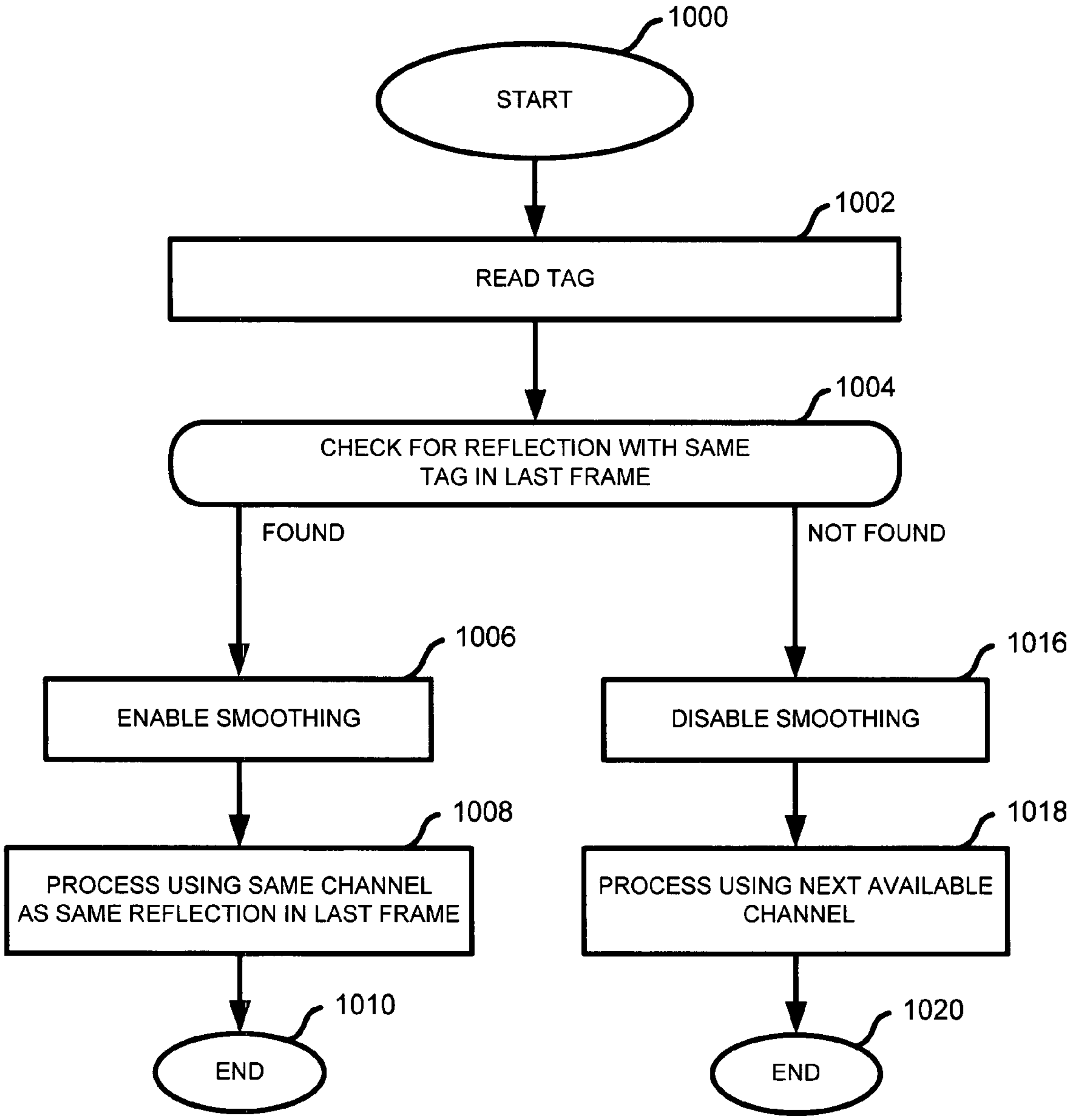
FIG. 10 is a flowchart illustrating a process for enabling and disabling smoothing for sounds originating as reflections.

FIG. 10 is a flowchart illustrating a process for enabling and disabling smoothing for sounds originating as reflections. The process starts at 1000. In a step 1002, the acoustic modeling processor reads the tag from the polygon that is causing the reflection that is being generated. Next, in a step 1004 the acoustic modeling processor checks whether a reflection with the same tag was generated in the last frame.

If a reflection with the same tag is found in the last frame, then control is transferred to a step 1006. The acoustic modeling processor includes a direction in the play list that enables smoothing for the reflection. The direction may be in the from of a flag or a bit that is set. In a step 1008, the acoustic modeling processor also includes a direction to play the reflection being processed using the same channel as the reflection in the previous frame used. The process then ends at 1010. Thus, reflections generated for a new frame are compared with reflections from the last frame and a direction is included in the play list to play such reflections using the same channel as the previous reflection.

If, in step 1004, the tag was not found for a reflection in the last frame, then control is transferred to a step 1016 and smoothing is disabled. Next, in a step 1018, a direction is included in the play list that the reflection may be rendered using the next available channel in the acoustic rendering system. The direction may be an explicit direction or by convention, the acoustic rendering system may simply render the reflection using the next available channel when no channel is specified. The process then ends at 1020.

Thus, reflections from the same source in different frames are played back using the same channel with smoothing enabled and reflections from different polygons are played back using an arbitrary channel with smoothing disabled so that reflections from different polygons are not blended together in different frames.

As mentioned above, the size of the rendering buffer may be reduced and the efficiency of communication between the application and the acoustic modeling processor may be increased by organizing certain polygons that reoccur in several frames into lists and storing such lists in a cache that is accessed by the rendering buffer. The list may be called by the application by simply naming the list and then the rendering buffer can include a pointer to the list in the cache and need not store all the polygons from the list in the rendering buffer.

Figure 11A:
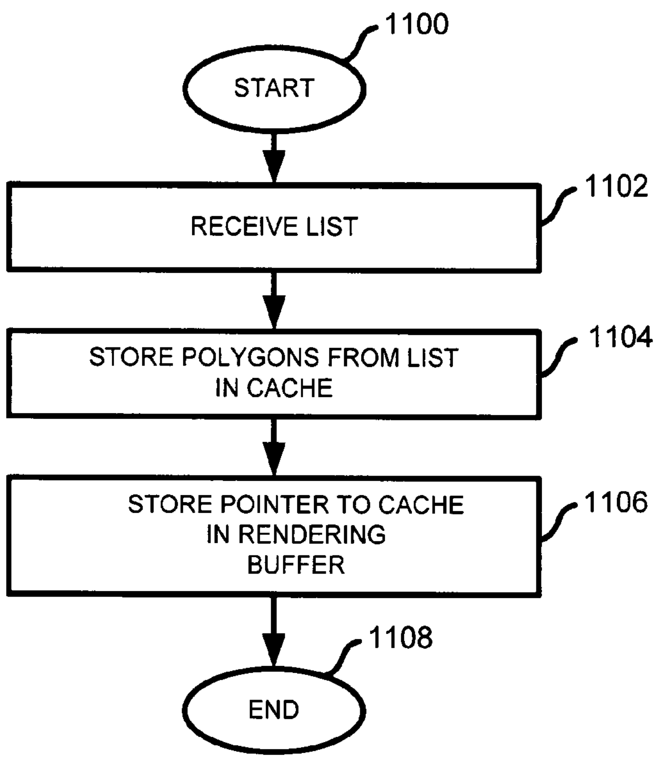
FIG. 11A is a process implemented when a list is received from the application.

FIG. 11A is a process implemented when a list is received from the application. The process starts at 1100. In a step 1102, a list is received from the application. Next, in a step 1104, the polygons from the list are stored in a cache. Finally, in a step 1106, a pointer to the place in the cache where the polygons are stored is included in the rendering buffer. Each time the list is called by the application, a new pointer is put in the rendering buffer so that when the rendering buffer is flushed upon the completion of a frame, the polygons in the rendering buffer are each set to the acoustic modeling processor and when a pointer to the cache is encountered, the polygons listed in the cache are sent to the acoustic modeling processor. The process ends at 1108.

Figure 11B:
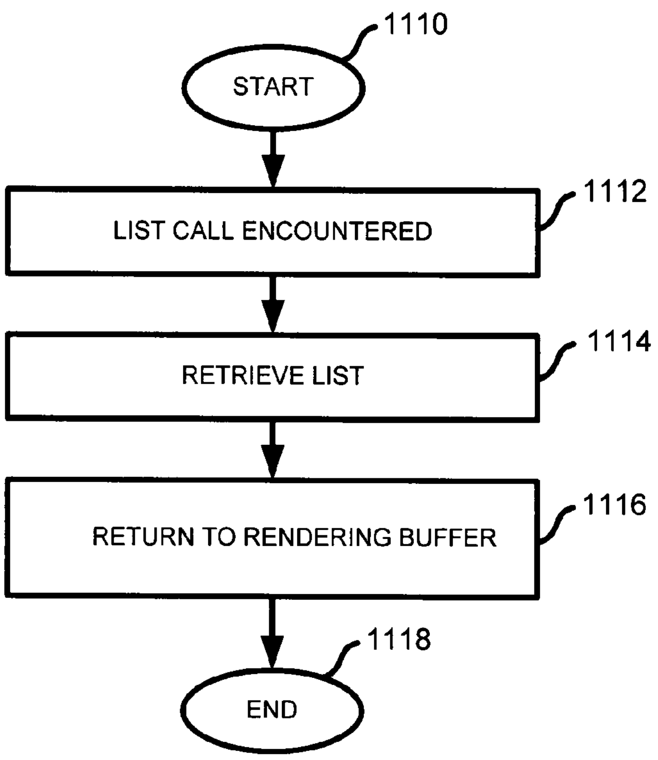
FIG. 11B is a flowchart illustrating a process that occurs when a function call for the list is encountered in the data being flushed from the rendering buffer.

FIG. 11B is a flowchart illustrating a process that occurs when a function call for the list is encountered in the data being flushed from the rendering buffer. The process starts at 1110. In a step 1112, a list call is encountered. In a step 1114, the polygons in the list are retrieved from the cache and sent to the acoustic modeling processor. When the last polygon in the list included in the cache is encountered, control is transferred to a step 1116 and the next polygon in the rendering buffer is sent to the acoustic modeling processor.

Thus, lists of polygons that recur in different frames are stored in a cache and those lists may be subsequently referenced in other frames, avoiding the need for the application to send every polygon in the list frame after frame.

A real time dynamic acoustic rendering system that reuses data generated for graphics rendering has been disclosed. The techniques described herein enables reflections and occlusions to be processed from the graphics data with only minimal changes made to the application that generates the graphics data. Processing resources are wisely used, with a greater update rate implemented for occlusions and reflections. Also, a difference size filter may be used for selecting polygons to be rendered for occlusions and reflections. Fast methods are used to determine occlusions and reflections including a fast method for finding second order reflections. In one embodiment, acoustic rendering using the techniques described is accomplished at a 30 frame per second rate with about 100 reflecting polygons processed and 1000 occlusions processed for 16 sounds. The processing demand on a Pentium II 400 MHz processor was about 3% of the processing capacity. Thus, dynamic acoustic rendering using graphics data from an application can be realized without unduly taxing a microprocessor.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method for acoustically rendering a virtual environment including:

receiving a set of polygons associated with an acoustic display;

determining whether one or more polygons in the set cause acoustic reflections of a sound source at a listener position in the virtual environment, wherein one or more polygons is located between the sound source and the listener position;

determining whether one or more polygons in the set cause occlusions of the sound source at the listener position; and generating a play list of sounds based on the reflections and occlusions, wherein a reflected sound causes the generation of a first sound and a second sound, the first sound corresponding to a direct path between the sound source and the listener and a second sound corresponding to an extra path length traveled by the reflected sound from the sound source to the listener.

2. A method as recited in claim 1, wherein the set of polygons associated with the acoustic display is derived from a set of polygons generated for a graphical display.

3. A method as recited in claim 1, wherein the set of polygons associated with the acoustic display is derived by applying a size filter to a set of polygons generated for a graphical display.

4. A method as recited in claim 1, further comprising inflating a size of a polygon in the set relative to an original size of the polygon generated for a graphical display.

5. A method as recited in claim 1, wherein a polygon in the set comprises a of one or polygons generated for a graphical display.

6. A method as recited in claim 1, wherein different size filters are defined for reflections and occlusions.

7. A method as recited in claim 1, wherein a rendering mode is specified for one or more polygons in the set of polygons, the rendering mode determining whether each is considered for occlusion or reflection determinations.

8. A method as recited in claim 1, wherein each polygon in the set is associated with an acoustic material type.

9. A method as recited in claim 8, wherein the acoustic material type of each polygon is associated with one or more of a reflection factor for acoustical reflections and an attenuation factor for acoustical occlusions.

10. A method as recited in claim 1, wherein a polygon in the set includes a subsurface which is associated with a subsurface factor.

11. A method as recited in claim 1, wherein acoustic reflections, if present, cause sound from the sound source to arrive to the listener position via a path that is not a direct path.

12. A method as recited in claim 1, wherein acoustic reflections comprise one or more of first order and second order acoustic reflections.

13. A method as recited in claim 1, wherein the play list includes one or more of a sound associated with a direct path from the sound source to the listener position, a sound from the sound source to the listener position adjusted by an attenuation factor due to an occlusion resulting from a polygon situated in between the sound source and the listener position, a sound from the sound source to the listener position adjusted by an attenuation factor and a subsurface factor due to an occlusion resulting from a subsurface of a polygon situated in between the sound source and the listener position, and a sound resulting from an acoustic reflection of the sound source by a polygon at the listener position.

14. A method as recited in claim 1, wherein the set of polygons is associated with a frame of the virtual environment.

15. A method performed by a system for acoustically rendering a polygon between a sound source having a strength and a listener position including:

determining whether a polygon generated by a graphics rendering application intersects a ray extending from the sound source to the listener position, wherein the polygon is located between the sound source and the listener position; and in the event that the polygon intersects the ray, attenuating the strength of the sound source, wherein attenuating the strength of the sound source includes determining an attenuation factor from a graphics texture associated with the polygon in the graphics rendering application;

determining whether a polygon generated by the graphics rendering application creates an acoustic reflection of the sound source to the listener position; and in the event that the polygon creates an acoustic reflection, including in a play list of sounds a sound associated with the acoustic reflection, wherein a reflected sound causes the generation of a first sound and a second sound, the first sound corresponding to a direct path between the sound source and the listener and a second sound corresponding to an extra path length traveled by the reflected sound from the sound source to the listener.

16. A method as recited in claim 15, further comprising adjusting an attenuation factor by a subsurface factor if the ray intersects a subsurface of the polygon.

17. A method performed by a system for acoustically rendering a polygon in a virtual environment, comprising:

receiving a rendering mode variable that enables reflections or occlusions;

determining whether a polygon generated by a graphics rendering application creates an acoustic reflection of a sound source at a listener position, wherein the polygon is located between the sound source and the listener position;

in the event that the polygon creates an acoustic reflection, including in a play list of sounds a sound associated with the acoustic reflection, wherein a reflected sound causes the generation of a first sound and a second sound, the first sound corresponding to a direct path between the sound source and the listener and a second sound corresponding to an extra path length traveled by the reflected sound from the sound source to the listener.

18. A system for acoustically rendering a virtual environment including:

a processor configured to:

receive a set of polygons associated with an acoustic display;

determine whether one or more polygons in the set cause acoustic reflections of a sound source at a listener position in the virtual environment, wherein one or more polygons is located between the sound source and the listener position;

determine whether one or more polygons in the set cause occlusions of the sound source at the listener position; and generate a play list of sounds based on the reflections and occlusions; and a memory coupled to the processor and configured to provide instructions to the processor, wherein a reflected sound causes the generation of a first sound and a second sound, the first sound corresponding to a direct path between the sound source and the listener and a second sound corresponding to an extra path length traveled by the reflected sound from the sound source to the listener.

19. A computer program product for acoustically rendering a virtual environment, the computer program product being embodied in a non-transitory computer readable medium and comprising computer instructions for:

receiving a set of polygons associated with an acoustic display;

determining whether one or more polygons in the set cause acoustic reflections of a sound source at a listener position in the virtual environment, wherein one or more polygons is located between the sound source and the listener position;

determining whether one or more polygons in the set cause occlusions of the sound source at the listener position; and generating a play list of sounds based on the reflections and occlusions, wherein a reflected sound causes the generation of a first sound and a second sound, the first sound corresponding to a direct path between the sound source and the listener and a second sound corresponding to an extra path length traveled by the reflected sound from the sound source to the listener.

* * * * *